(12) United States Patent
Kim et al.

(10) Patent No.: US 10,083,337 B2
(45) Date of Patent: Sep. 25, 2018

(54) FINGERPRINT DETECTION DEVICE AND DRIVING METHOD THEREOF

(71) Applicant: Crucialtec Co., Ltd., Asan-si (KR)

(72) Inventors: Kyung Saeng Kim, Anyang-si (KR); Dong Il Seo, Suwon-si (KR); Jeong Min Kim, Seongnam-si (KR)

(73) Assignee: Crucialtec Co., Ltd., Asan-si (KR)

( * ) Notice: Subject to any disclaimer, the term of this patent is extended or adjusted under 35 U.S.C. 154(b) by 267 days.

(21) Appl. No.: 15/100,596

(22) PCT Filed: Dec. 3, 2014

(86) PCT No.: PCT/KR2014/011791
§ 371 (c)(1),
(2) Date: May 31, 2016

(87) PCT Pub. No.: WO2015/084062
PCT Pub. Date: Jun. 11, 2015

(65) Prior Publication Data
US 2016/0307021 A1     Oct. 20, 2016

(30) Foreign Application Priority Data

Dec. 4, 2013    (KR) .................. 10-2013-0149950
Dec. 18, 2013   (KR) .................. 10-2013-0158725

(51) Int. Cl.
*G06K 9/00*     (2006.01)
*G06K 7/10*     (2006.01)
(Continued)

(52) U.S. Cl.
CPC ....... *G06K 9/0002* (2013.01); *G06K 7/10722* (2013.01); *G06K 19/073* (2013.01); *G11C 27/024* (2013.01)

(58) Field of Classification Search
CPC .............. G06K 9/0002; G06K 19/073; G06K 7/10722; G06F 21/79; G11C 27/024
See application file for complete search history.

(56) References Cited

U.S. PATENT DOCUMENTS 5,325,442 A * 6/1994 Knapp ................... G01B 7/004
361/278
5,778,089 A * 7/1998 Borza .................. G06K 9/0002
250/556

(Continued)

FOREIGN PATENT DOCUMENTS

KR    20-1999-0040140    11/1999
KR    10-2003-0073508     9/2003
(Continued)

OTHER PUBLICATIONS

International Search Report dated Mar. 9, 2015 in International Application No. PCT/KR2014/011791.

*Primary Examiner* — Manav Seth
(74) *Attorney, Agent, or Firm* — H.C. Park & Associates, PLC

(57) ABSTRACT

A fingerprint detection device including a sensor array including a plurality of fingerprint sensor elements arranged in a form of a matrix having a plurality of rows and columns, a filter and buffer unit including a plurality of first banks, each of which is configured to perform a noise elimination operation and a temporal storage operation in parallel with respect to output signals of some different columns of the sensor array. Each of the plurality of first banks simultaneously or consecutively acquires output signals from the fingerprint sensor elements belonging to columns spaced apart from each other by a predetermined distance. A sample and hold unit including second banks, the number of which being the same as the number of the plurality of first banks, performs a sampling and hold function in parallel in (Continued)

response to output signals from the plurality of first banks. An input/output unit receives an output signal from the sample and hold unit to output data of the sensor array.

6 Claims, 5 Drawing Sheets

(51) Int. Cl.
*G11C 27/02* (2006.01)
*G06K 19/073* (2006.01)

(56) References Cited

U.S. PATENT DOCUMENTS

| | | | |
|---|---|---|---|
| 6,727,800 B1* | 4/2004 | Dutu | B60R 25/02102 |
| | | | 123/179.1 |
| 7,075,316 B2* | 7/2006 | Umeda | G01R 27/2605 |
| | | | 324/658 |
| 2006/0158202 A1* | 7/2006 | Umeda | G06K 9/0002 |
| | | | 324/686 |
| 2006/0222218 A1* | 10/2006 | Karaki | G06K 9/0002 |
| | | | 382/124 |
| 2012/0092026 A1 | 4/2012 | Liautaud et al. | |
| 2013/0287274 A1* | 10/2013 | Shi | G06F 3/044 |
| | | | 382/124 |
| 2017/0098115 A1* | 4/2017 | Wickboldt | G06K 9/00026 |
| 2017/0330014 A1* | 11/2017 | Ramberg | G06K 9/0002 |
| 2017/0364178 A1* | 12/2017 | Nelson | G06K 9/0002 |

FOREIGN PATENT DOCUMENTS

| | | |
|---|---|---|
| KR | 10-2008-0045037 | 5/2008 |
| KR | 10-2013-0127980 | 11/2013 |

* cited by examiner

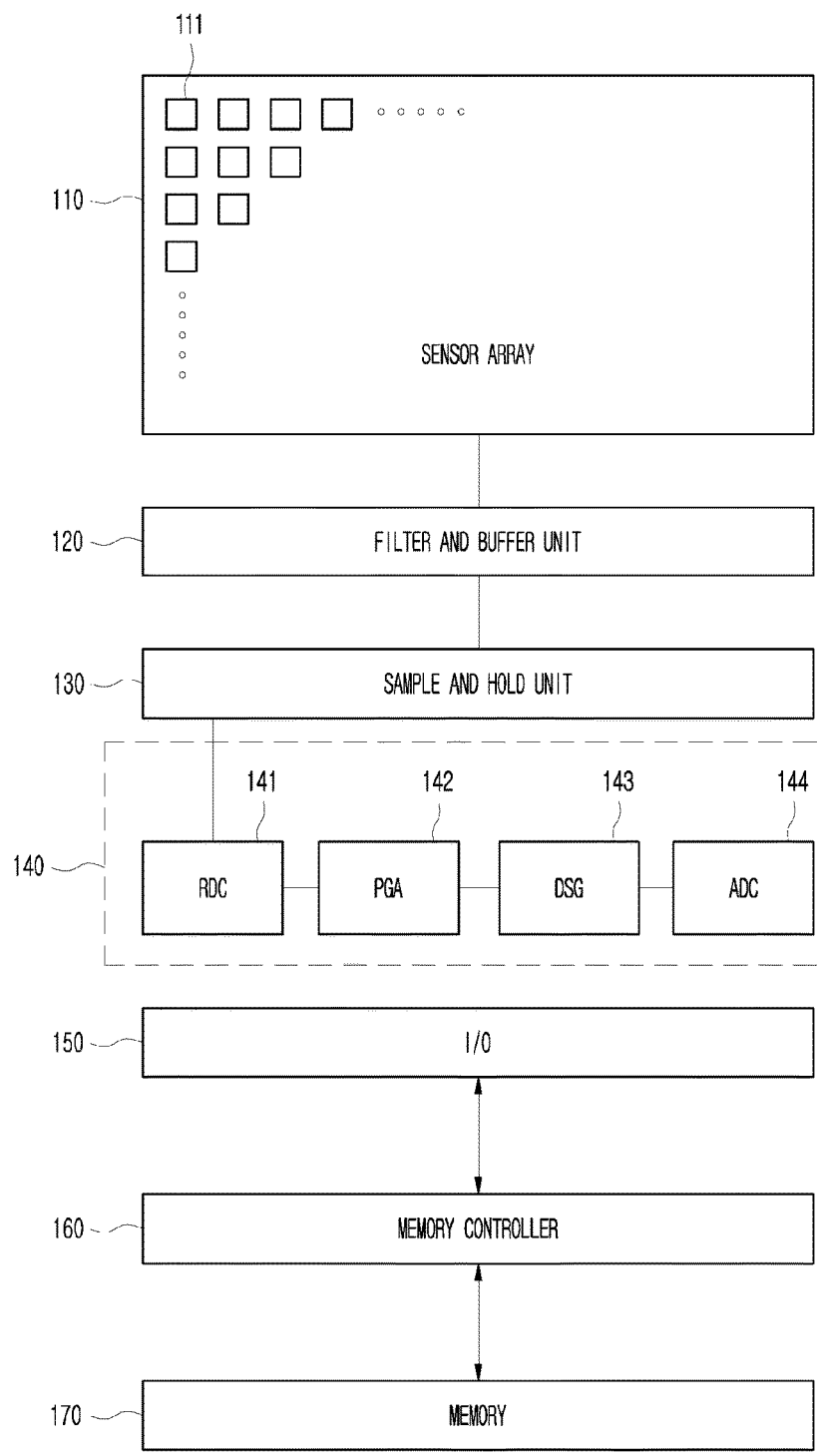
[FIG. 1]

[FIG. 2]
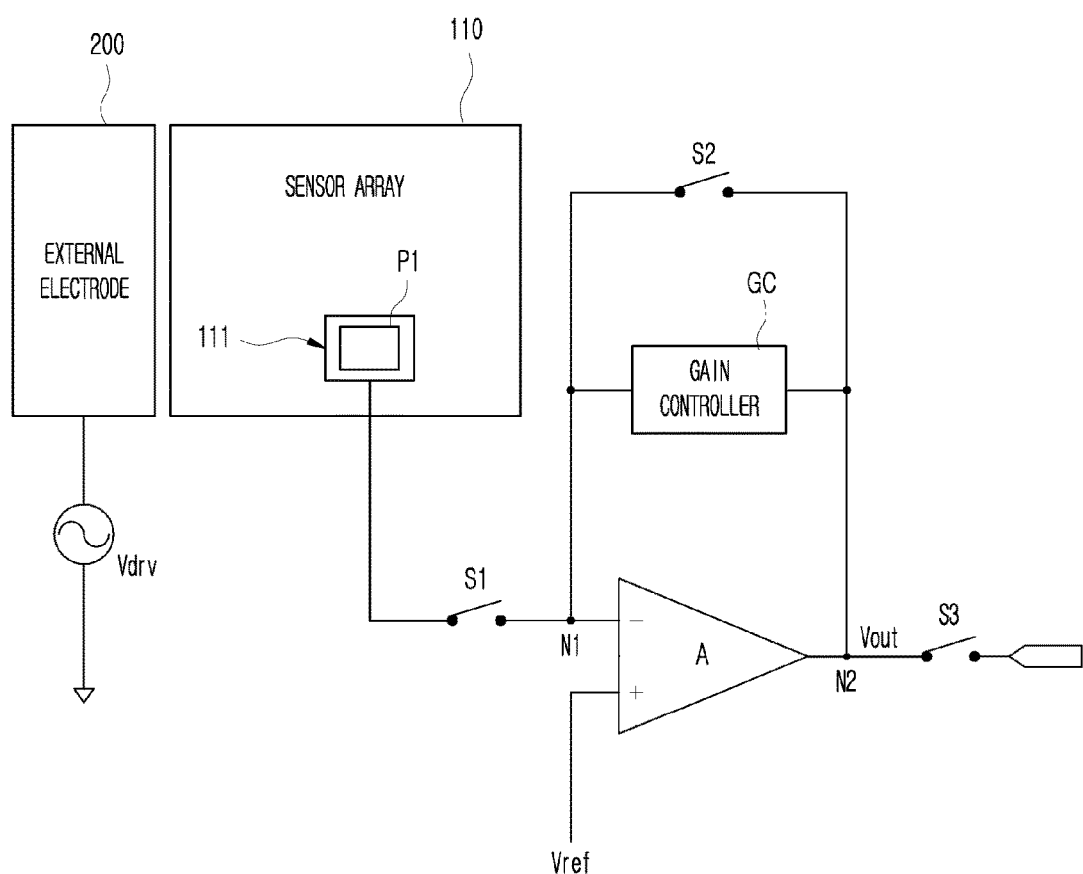

[FIG. 3]
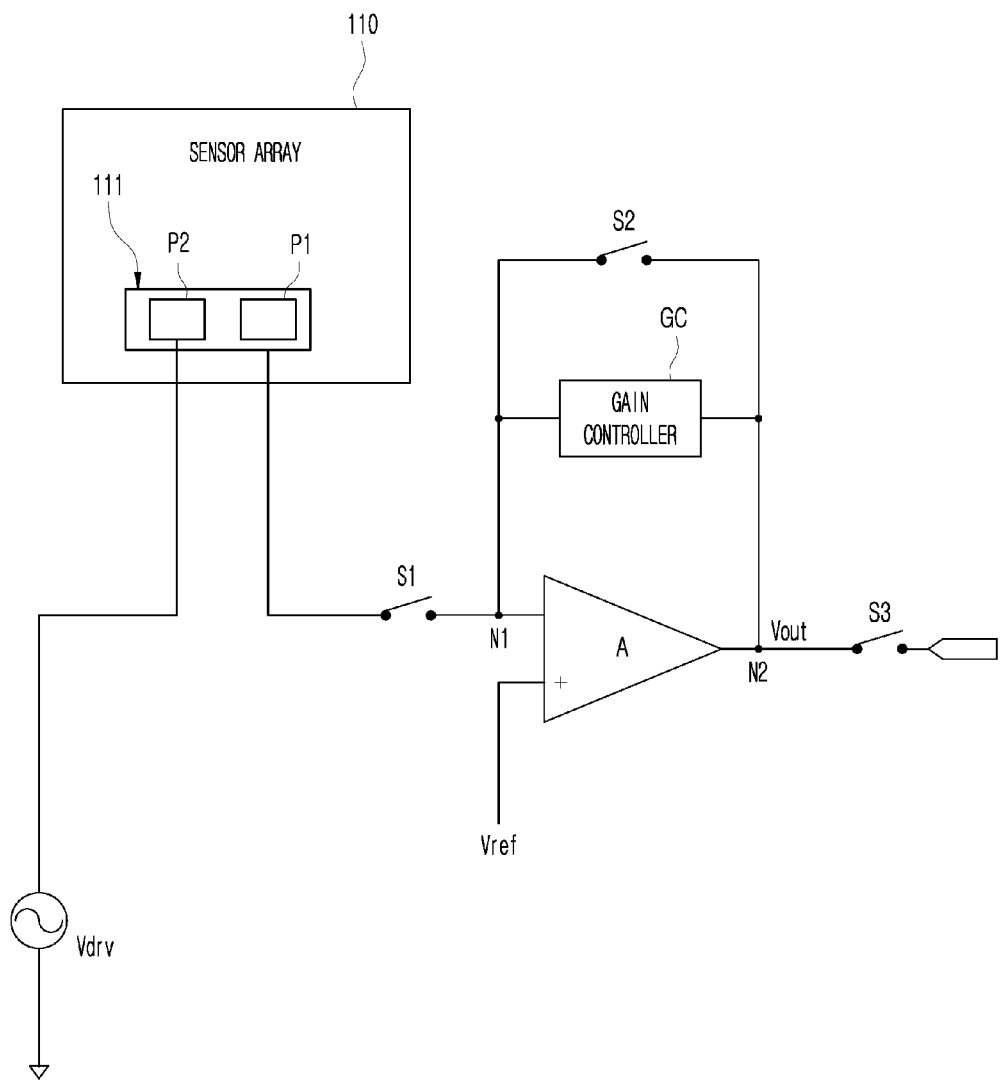

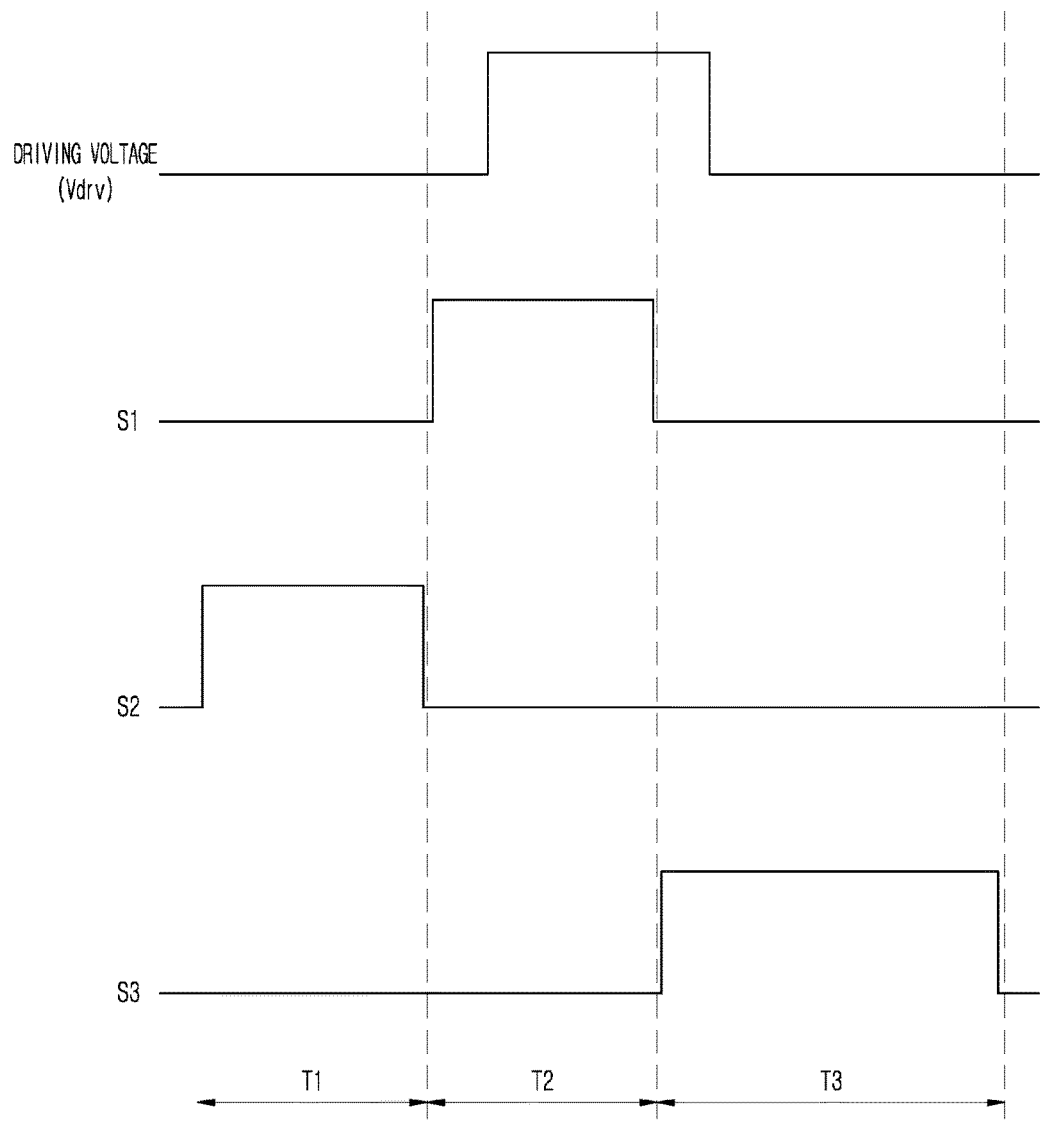

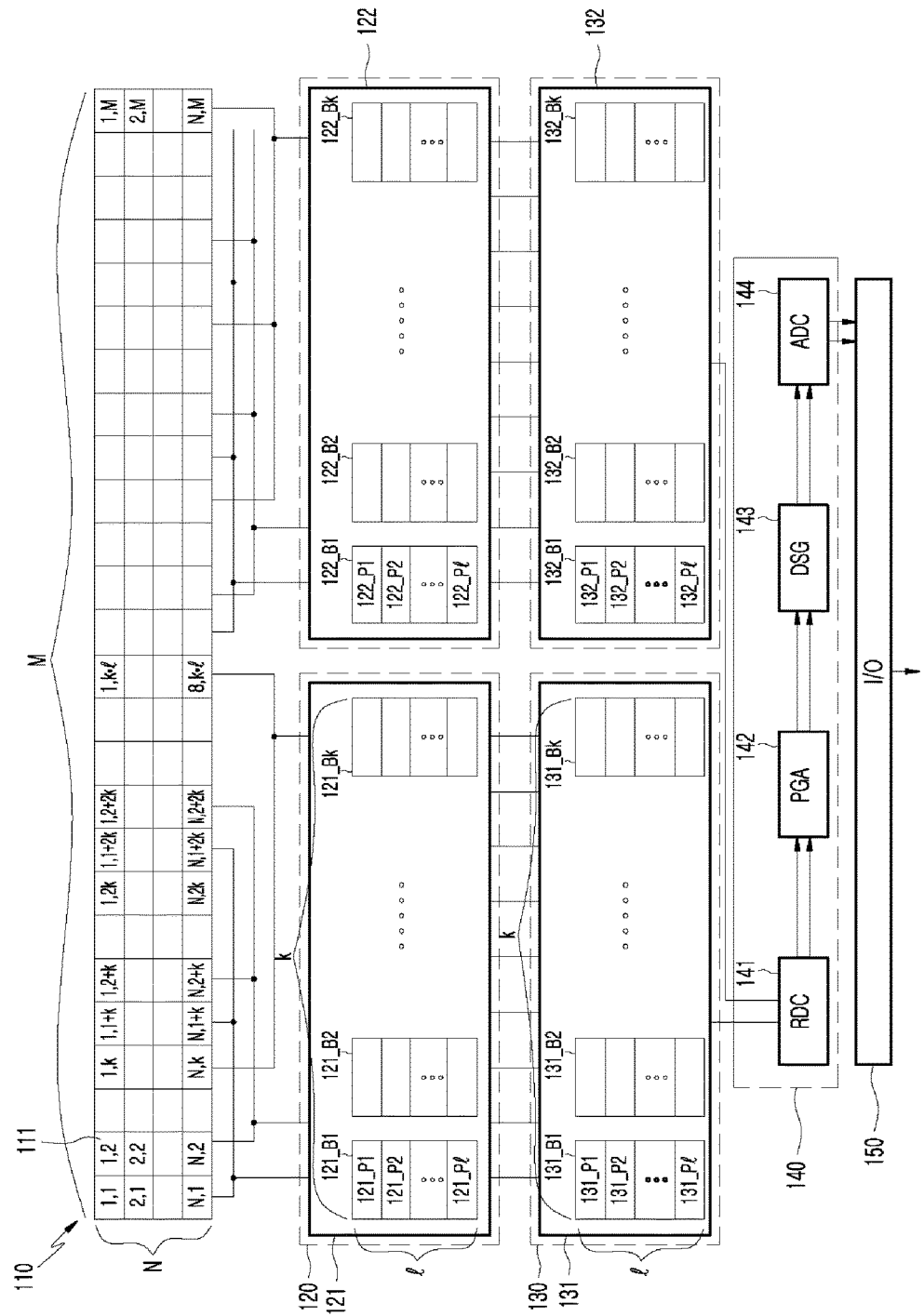
[FIG. 5]

FINGERPRINT DETECTION DEVICE AND DRIVING METHOD THEREOF

CROSS-REFERENCE TO RELATED APPLICATIONS

This application is the National Stage Entry of International Application No. PCT/KR2014/011791, filed on Dec. 3, 2014, and claims priority from and the benefit of Korean Patent Application No. 10-2013-0149950, filed on Dec. 4, 2013, and Korean Patent Application No. 10-2013-0158725, filed on Dec. 18, 2013, all of which are incorporated herein by reference for all purposes as if fully set forth herein.

BACKGROUND

Field

The present invention relates to a fingerprint detection device and a driving method therefor, and more particularly, to a fingerprint detection device improved in a detection operation speed and a detection accuracy, and a driving method thereof.

Discussion of the Background

Since a pattern of a fingerprint varies from person to person, it has been widely used in a personal identification field. Specifically, as a personal verification means, a fingerprint has been widely used in a variety of fields including banking, criminal investigation, security and the like.

A fingerprint recognition sensor has been developed to recognize such a fingerprint, thereby identifying a person. The fingerprint recognition sensor is a device for recognizing a fingerprint of a person by coming in contact with a finger thereof, and is utilized as a means for determining whether or not a person has a proper right.

A fingerprint detection device, which recognizes a feature of each area of a fingerprint to obtain a fingerprint image, includes a sensor array configured with a plurality of fingerprint sensor elements provided in a form of a matrix.

The plurality of fingerprint sensor elements come in contact with some portion of a finger, and generate different signals according to whether some portion of the finger being currently contacted is a ridge or a valley thereof. In particular, a driving signal is applied to a finger, and the fingerprint sensor element generates a different response signal depending on a portion of the finger coming in contact with the fingerprint sensor element.

Meanwhile, noise due to an external environment or induced by an internal configuration of a fingerprint detection device or the like may be included in output signals from the plurality of fingerprint sensor elements. In order to eliminate such noise, the output signal from each of the fingerprint sensor elements is transmitted to a filter and buffer unit.

Currently, when the plurality of fingerprint sensor elements are arranged in a form of N×M matrix, a scan operation with respect to the fingerprint sensor elements from a first column to an M-th column, that is, a fingerprint detection operation is sequentially performed, and an output signal from the fingerprint sensor element corresponding to each column is sequentially transmitted to the filter and buffer unit.

In other words, an output signal acquisition from the plurality of fingerprint sensor elements sequentially proceeds from the first column to the M-th column. If the number of columns of the sensor array is increased, a time required for performing a fingerprint detection operation at once with respect to all the fingerprint sensor elements should be increased.

In addition, according to the current method described above, an output signal acquisition from the fingerprint sensor elements arranged at an adjacent column is consecutively performed. In other words, after the output signal acquisition from the fingerprint sensor elements arranged at the first column is completed, an output signal acquisition from the fingerprint sensor elements arranged at a second column adjacent to the first column is consecutively performed. When the fingerprint detection operation with respect to a fingerprint sensor element is performed, an electrical signal flows at the fingerprint sensor element and this may be a cause for forming a parasitic capacitance and the like in interaction with a neighboring fingerprint sensor element. That is, the neighboring fingerprint sensor element would be electrically affected by the fingerprint detection operation with respect to the fingerprint sensor element. Therefore, when the fingerprint detection operation with respect to the neighboring fingerprint sensor element is proceeds consecutively, a fingerprint detection may be largely affected by an external environment to cause a degradation of accuracy of the fingerprint detection.

Consequently, a fingerprint detection device capable of improving not only accuracy of a fingerprint detection but also a speed thereof may be needed.

SUMMARY OF THE INVENTION

An object of the present invention is to address the problems described above.

Another object of the present invention is to provide a fingerprint detection device capable of improving not only a speed of a fingerprint detection but also accuracy thereof.

In accordance with an exemplary embodiment of the present invention for attaining the objects described above, a fingerprint detection device is provided to include a sensor array including a plurality of fingerprint sensor elements arranged in a form of a matrix having a plurality of rows and columns, a filter and buffer unit including a plurality of first banks, each of which is configured to perform a noise elimination operation and a temporal storage operation in parallel with respect to output signals of some different columns of the sensor array. Each of the plurality of first banks simultaneously or consecutively acquires output signals from the fingerprint sensor elements belonging to columns spaced apart from each other by a predetermined distance, a sample and hold unit including second banks having the same number as the number of the plurality of first banks so as to perform a sampling and hold function in parallel in response to output signals from the plurality of first banks, and an input/output unit configured to receive an output signal from the sample and hold unit to output data of the sensor array.

Each of the first and second banks may include n blocks, the n blocks may receive in parallel the output signals of the fingerprint sensor elements from a group of columns of the sensor array corresponding to the first and second banks, and the group may be configured with the columns arranged to be spaced apart from each other.

Each of the blocks of the first and second banks may be configured with pages having the same number as the number of columns belonging to the group of the sensor array, and each of the pages may receive the output signals of the columns arranged to be spaced apart from each other and belonging to the group of the sensor array.

Meanwhile, in accordance with another exemplary embodiment, a driving method of a fingerprint detection device including a plurality of fingerprint sensor elements arranged in a form of a matrix is provided to include (a) inputting output signals with respect to some different columns of a sensor array in parallel to assigned banks among a plurality of first banks of a filter and buffer unit, wherein output signals from the fingerprint sensor elements belonging to columns spaced apart from each other by a predetermined distance are simultaneously or sequentially input, (b) inputting output signals from the first banks in parallel to second banks of a sample and hold unit corresponding to the first banks, and (c) inputting output signals from the sample and hold unit to an input/output unit via a signal processor.

The first and second banks may be configured with n blocks, and the operation (a) may include inputting the output signals of the fingerprint sensor elements from a group of columns of the sensor array configured with the columns spaced apart from each other to each of the blocks.

Each of the blocks may be configured with pages having the same number as the number of columns belonging to the group of the columns of the sensor array, and the operation (a) may include each of the pages receiving the output signals of the columns arranged to be spaced apart from each other and belonging to the group of the columns of the sensor array.

In accordance with the present invention, in the sensor array, the output signals from the fingerprint sensor elements belonging to a plurality of columns are simultaneously input to the filter and buffer unit configured with a plurality of banks, such that an operation speed of a fingerprint detection may be faster.

Also, in accordance with the present invention, an output signal acquisition with respect to a fingerprint sensor element belonging to a neighboring column is not simultaneously performed, such that an effect due to a fingerprint detection operation of a neighboring fingerprint sensor element may be minimized against a fingerprint detection operation of a fingerprint sensor element to improve accuracy of a fingerprint detection.

BRIEF DESCRIPTION OF THE DRAWINGS

FIG. 1 is a block diagram illustrating an entire configuration of a fingerprint detection device according to an exemplary embodiment of the present invention.

FIG. 2 is a circuit diagram illustrating a configuration of a fingerprint sensor element according to one exemplary embodiment of the present invention.

FIG. 3 is a circuit diagram illustrating a configuration of a fingerprint sensor element according to another exemplary embodiment of the present invention.

FIG. 4 is a timing diagram for describing an operation of the fingerprint sensor element according to one exemplary embodiment of the present invention.

FIG. 5 is a detailed block diagram illustrating a configuration of the fingerprint detection device according to one exemplary embodiment of the present invention.

DETAILED DESCRIPTION OF THE ILLUSTRATED EMBODIMENTS

Hereinafter, the present invention will be described with reference to the accompanying drawings. However, the present invention may be implemented in various different forms, and thus it is not limited to embodiments to be described herein. Also, in the accompanying drawings, parts not related to a description will be omitted in order to clearly describe the present invention, and the same or similar reference numerals are given to components having the same or similar functions throughout the disclosure.

Throughout the disclosure, when a part is described as "connected" to other part, it should be construed to include a case in which the part is "directly connected" to the other part as well as "indirectly connected" thereto by interposing other member between the part and the other part. Also, the terms of "comprise," "configure" and/or "have" specify the presence of stated components, unless there is a clearly different meaning in the present application, and do not preclude the presence of other components.

Hereinafter, embodiments of the present invention will be described in detail with reference to the accompanying drawings.

FIG. 1 is a block diagram schematically illustrating an entire configuration of a fingerprint detection device according to an embodiment of the present invention.

With reference to FIG. 1, a fingerprint detection device according to an embodiment may include a sensor array 110, a filter and buffer unit 120, a sample and hold unit 130, a signal processor 140, an input/output unit 150, a memory controller 160, and a memory 170.

The sensor array 110 may include a plurality of fingerprint sensor elements 111 arranged to from a plurality of rows and columns. According to an arrangement form of the fingerprint sensor elements 111, it may be classified into a variety of types. For example, the fingerprint sensor elements 111 configure the sensor array 110 in a form of N×M matrix, and if N<<M is satisfied, the sensor array 110 may configure a fingerprint detection device of a bar type extending in a horizontal direction. Each of the fingerprint sensor elements 111 may include a sensing electrode which forms capacitance in interaction with a subject (a finger and the like). A fingerprint detection method through the fingerprint sensor element 111 will be described later.

The filter and buffer unit 120 temporarily stores an output signal from the fingerprint sensor element 111 and serves a filter function to eliminate noise. The output signals from the plurality of fingerprint sensor elements 111 are analyzed to obtain a fingerprint image, and a signal component due to external noise and the like may be fatally included in the output signal of the fingerprint sensor element 111. Therefore, the filter and buffer unit 120 is equipped with a low-pass filter and the like to serve to eliminate such noise. The filter and buffer unit 120 according to the embodiment of the present invention is divided into a plurality of banks and serves to filter and temporarily store output signals of some of the plurality of fingerprint sensor elements 111 configuring the sensor array 110.

The sample and hold unit 130 serves to sample and hold a signal in which noise is eliminated by the filter and buffer unit 120 and to store the sampled value. A sampling period of the sample and hold unit 130 is controlled by a predetermined clock signal.

The signal processor 140 processes a correction of an output signal from the sample and hold unit 130. For example, the signal processor 140 serves to perform an offset adjustment of the output signal, an amplification process thereof, and a conversion function thereof to a digital signal. As one embodiment, the signal processor 140 may include a related data calibration (RDC) 141, a programmable gain amplifier (PGA) 142, a differential signal generator (DSG) 143, and an analog-to-digital converter (ADC) 144.

The RDC 141 serves to adjust an offset with respect to the output signal of the sample and hold unit 130, that is, the output signal from the fingerprint sensor element 111, which is sampled at a regular time interval after an effect of noise is eliminated.

The PGA 142 serves to amplify a sensing signal to a predetermined ratio. Since a fingerprint of a person is made of a ridge and a valley, a different output signal may be generated according to whether the fingerprint sensor element 111 comes in contact with the ridge or the valley. In other words, an output signal, which has a different magnitude according to whether the ridge or the valley comes in contact with the fingerprint sensor element 111, is generated, and a gain of the PGA 142 is controlled to be high so as to increase a magnitude difference and, on the other hand, the gain thereof is controlled to be low so as to decrease the magnitude difference.

The ADC 144 serves to convert the sensing signal of an analog form into a sensing signal of a digital form. The sensing signal converted into the digital form is input to the input/output unit 150.

Signals input to the input/output unit 150 may be output in a form of entire data of the sensor array. For example, the memory controller 160 may receive data of the sensor array to access the memory 170. The memory 170 stores a value output through the input/output unit 150, and transmits the value later to a host device (for example, a mobile device or a specific intelligent element, a specific application and the like in the mobile device) to place it in a usable state.

Hereinafter, a procedure in which a sensing signal related to a fingerprint detection is output by the fingerprint sensor element 111 will be described.

FIG. 2 is a circuit diagram illustrating a configuration of the fingerprint sensor element 111 according to one exemplary embodiment of the present invention.

With reference to FIG. 2, it can be seen that the fingerprint detection device includes the sensor array 110 and an external electrode (or bezel) 200. The external electrode 200 is insulated from the sensor array 110 to be arranged at a periphery thereof. The external electrode 200 serves to transmit a driving voltage Vdrv for a fingerprint sensing to a subject (a finger). In other words, the driving voltage Vdrv is applied to the external electrode 200 to be supplied to a finger of a person therethrough, and, in response to the driving voltage Vdrv, a predetermined signal is output from each of the fingerprint sensor elements 111 of the sensor array 110.

Meanwhile, the fingerprint sensor element 111 according to one exemplary embodiment has a single electrode P1 as a sensing electrode. The sensing electrode P1 is selectively connected to a first input terminal N1 of an amplifier A. A reference voltage Vref is supplied to a second input terminal of the amplifier A. The first input terminal N1 of the amplifier A and the second input terminal thereof may be an inverting input terminal and a non-inverting input terminal, respectively. A gain controller GC is connected between the first input terminal N1 of the amplifier A and an output terminal N2 thereof. The gain controller GC is a component for varying a gain of the amplifier A, and may be configured with a variable capacitance and the like, for example.

A connection between the first input terminal N1 of the amplifier A and the sensing electrode P1 is switched on and off by a first switch S1, and a second switch S2 is connected between both ends of the gain controller GC. Also, a third switch S3 is connected to the output terminal N2 of the amplifier A. The first switch S1 is a switch for enabling the fingerprint sensor element 111 to receive a signal from a finger according to the driving voltage Vdrv, and the second switch S2 is a switch for resetting data stored in the gain controller GC of the amplifier A. In addition, the third switch S3 may be a switch for selectively opening an output of the fingerprint sensor element 111, that is, for selectively controlling the output signal of the fingerprint sensor element 111 to be transmittable to an external device. An operation of the first to third switches S1 to S3 upon performing a fingerprint detection will be described later in detail.

FIG. 3 is a circuit diagram illustrating a configuration of a fingerprint sensor element according to another exemplary embodiment of the present invention.

With reference to FIG. 3, the present exemplary embodiment also includes a plurality of fingerprint sensor elements 111 arranged to form a row and a column to configure a sensor array 110. A difference from the exemplary embodiment described with reference to FIG. 2 is that the external electrode 200 (See FIG. 2) is omitted and a single fingerprint sensor element 111 includes a sensing electrode P1 and a driving voltage apply electrode P2.

According to the present exemplary embodiment, a driving voltage Vdrv is applied through the driving voltage apply electrode P2 of each of the fingerprint sensor elements 111, and a response signal from a finger is input to a first input terminal N1 of an amplifier A through the sensing electrode P1. That is, it can be understood that the function of the external electrode 200 in the exemplary embodiment of FIG. 2 may be replaced with the driving voltage apply electrode P2 of the fingerprint sensor element 111 in the present exemplary embodiment. A configuration except the driving voltage apply electrode P2 is the same as that shown in FIG. 2, so that a description thereof will be omitted.

FIG. 4 is a timing diagram for describing an operation of each switch in the fingerprint detection device described with reference to FIGS. 2 and 3.

A high and a low shown in FIG. 4 with respect to each of the switches S1 to S3 mean an ON state and an OFF state, respectively. Also, a high shown with respect to the driving voltage Vdrv means that the driving voltage Vdrv is applied to the external electrode 200 (FIG. 2) or the driving voltage apply electrode P2, and a low means that the driving voltage Vdrv is not applied thereto. According to the exemplary embodiment, the driving voltage Vdrv may be a pulse signal controlled by a clock signal, and may be variously implemented by an alternating current (AC) voltage or a direct current (DC) voltage, which has a predetermined frequency.

With reference to FIGS. 2 to 4, to begin with during a T1 period, the second switch S2 is turned on, and the first switch S1 and the third switch S3 are turned off. As the second switch S2 is to be an ON state, data stored in the gain controller GC of the amplifier A is reset. For example, feedback capacitances included in the gain controller GC may be reset. At this point, because the first switch S1 is turned off, a current does not flow from the sensing electrode P1 to the first input terminal N1 of the amplifier A. The plurality of fingerprint sensor elements 111 are arranged on the sensor array 110 at very close intervals, such that there may occur an effect caused by a current flowing at a neighboring fingerprint sensor element 111. In other words, when a current flows at a neighboring fingerprint sensor element 111, a parasitic capacitance is formed in interaction with the neighboring fingerprint sensor element 111 so that accuracy of a fingerprint detection may be negatively influenced. In order to address the problem, according to the present invention, when there is no need to apply a signal to the first input terminal N1 of the amplifier A in a fingerprint detection preparation stage and the like, the first switch S1 is turned off to block a current flow, thereby minimizing any effect that may influence the neighboring fingerprint sensor element 111. For example, while the neighboring fingerprint sensor element 111 performs a fingerprint detection operation, the first switch S1 of the fingerprint detection element 111 may be controlled to be turned off.

After the resetting of the data stored in the gain controller GC of the amplifier A is completed, a T2 period is commenced. The T2 period is a period in which a response signal according to an applying of the driving voltage Vdrv is received through the sensing electrode P1 and the amplifier A forms an output voltage. If the T2 period is commenced, the first switch S1 is switched to an ON state to prepare for receiving a response signal according to the driving voltage Vdrv. The applying of the driving voltage Vdrv may be performed at the same time or at a time after when the first switch S1 is switched to the ON state. During the T2 period, the second switch S2 is turned off and thus a feedback capacitance is formed at the amplifier A. The gain controller GC forms a variable impedance between the first input terminal N1 of the amplifier A and the output terminal N2 thereof. For example, a gain of the amplifier A may be adjusted by selectively connecting a plurality of capacitances between the first input terminal N1 of the amplifier A and the output terminal N2 thereof. During the T2 period, the third switch S3 is also turned off.

A T3 period is a period in which an output voltage Vout formed by the amplifier A during the T2 period is output so as to perform an arithmetic operation. In the T3 period, the third switch S3 connected to the output terminal N2 of the amplifier A is switched to an ON state, and the first switch S1 and the second switch S2 are turned off. The third switch S3 is maintained in the ON state for an appropriate time so as to enable the response signal according to the driving voltage Vdrv to be fully transmitted. For example, the third switch S3 may be maintained in the ON state until a potential of the external electrode 200 or the driving voltage apply electrode P2 is dropped to 0 volts (or a ground voltage). As shown in the drawing, the period in which the driving voltage Vdrv is applied and the period in which the third switch S3 is maintained in the ON state may be overlapped with each other for a predetermined time, but they may not be overlapped with each other.

Hereinafter, configurations of the filter and buffer unit 120 and the sample and hold unit 130 in the fingerprint detection device according to the embodiment of the present invention will be described.

FIG. 5 is a block diagram illustrating a configuration of a part of the fingerprint detection device according to the exemplary embodiment of the present invention.

With reference to FIG. 5, the filter and buffer unit 120 and the sample and hold unit 130 of the fingerprint detection device according to the exemplary embodiment of the present invention are respectively configured with a plurality of banks. For example, the filter and buffer unit 120 may be divided into a first bank 121 and a second bank 122, and the sample and hold unit 130 may also be divided into a first bank 131 and a second bank 132.

As described above, the sensor array 110 includes the plurality of fingerprint sensor elements 111 forming a plurality of rows and columns, output signals from some fingerprint sensor elements 111_1 of the fingerprint sensor elements 111 are input to the first bank 121 of the filter and buffer unit 120, and output signals from the remaining fingerprint sensor elements 111_2 thereof are input to the second bank 122 of the filter and buffer unit 120. The signal from the fingerprint sensor element 111 is output while the third switch S3 is switched to the ON state which is described with reference to FIGS. 2 to 4.

When the fingerprint sensor elements 111 are arranged in a form of N×M matrices, output signals of a first column to an M/2th column of the fingerprint sensor elements 111_1 may be input to the first bank 121 of the filter and buffer unit 120, and output signals of a column next the M/2th column to an Mth column of the fingerprint sensor element 111_2 may be input to the second bank 122 thereof.

Meanwhile, the bank 121 or 122 of the filter and buffer unit 120 is configured with a plurality of blocks 121_B1, 121_B2, 121_Bk, or 122_B1, 122_B2, 122_Bk, and the blocks 121_B1, 121_B2, 121_Bk, or 122_B1, 122_B2, 122_Bk are configured with a plurality of pages 121_P1, 121_P2, 121_P1, or 122_P1, 122_P2, 122_P1.

The output signals of the fingerprint sensor elements 111 configuring a single column are input to and stored in a single page 121_P1, 121_P2, 121_P1, or 122_P1, 122_P2, 122_P1. Therefore, if each of the blocks 121_B1, 121_B2, 121_Bk, or 122_B1, 122_B2, 122_Bk is configured with one page 121_P1, 121_P2, 121_Pk, or 122_P1, 122_P2, 122_Pk, one block 121_B1, 121_B2, 121_Bk, or 122_B1, 122_B2, 122_Bk receives and stores output signals from one column of the fingerprint sensor elements 111.

For example, when the bank 121 or 122 of the filter and buffer unit 120 is configured with k blocks 121_B1, 121_B2, 121_Bk, or 122_B1, 122_B2, 122_Bk and each of blocks 121_B1, 121_B2, 121_Bk, or 122_B1, 122_B2, 122_Bk is configured with one page 121_P1, 121_P2, 121_P1, or 122_P1, 122_P2, 122_P1, a first block 121_B1 of the first bank 121 receives and stores output signals of a first column, a (1+k)-th column, a (1+2k)-th column, . . . , and an (1+(1−1)k)-th column of the fingerprint sensor elements 111 in the sensor array 110. The output signals of the first column, the (1+k)-th column, the (1+2k)-th column, . . . , and the (1+(1−1)k)-th column of the fingerprint sensor elements 111 are input to and stored in one page 121_P1, 121_P2, and 121_P1 configuring the first block 121_B1, respectively. In similar, a second block 121_B2 of the first bank 121 receives and stores output signals of a second column, a (2+k)-th column, a (2+2k)-th column, . . . , and a (2+(1−1)k)-th column of the fingerprint sensor elements 111 in the sensor array 110. A k-th block 121_Bk also receives and stores output signals of a k-th column, a (k+k)-th column, a (k+2k)-th column, . . . , a (k+(1−1)k)-th column of the fingerprint sensor elements 111 in the sensor array 110. With such an operation, the bank configured with one page and the k blocks may receive and store the output signals of the fingerprint sensor elements 111 corresponding to 1×k columns. As being the same as the first bank 121, the second bank 122 may be configured with k blocks 122_B1, 122_B2, and 122_Bk and one page 122_P1, 122_P2, and 122_P1, and may operate simultaneously with the first bank 121 to receive output signals with respect to an ((M/2)+1)-th column to an M-th column of the fingerprint sensor elements 111 among the plurality of the fingerprint sensor elements 111.

Meanwhile, data is sequentially input to the blocks 121_B1, 121_B2, and 121_Bk, or 122_B1, 122_B2, and 122_Bk configuring the bank 121 or 122. In other words, after all the output signals of the first column, the (1+k)-th column, the (1+2k)-th column, . . . , and the (1+(1−1)k)-th column of the fingerprint sensor elements 111 have been input to the first block 121_B1, the output signals of the second column, the (2+k)-th column, the (2+2k)-th column, . . . , and the (2+(1−1)k)-th column of the fingerprint sensor elements 111 are input to the second block 121_B2. Since one block 121_B1, 121_B2, or 121_Bk does not receive data of the fingerprint sensor elements 111 arranged at a neighboring column in the sensor array 110, that is, receives data from the fingerprint sensor elements 111 included in a column group configured with columns arranged to be spaced apart from each other, the output signal of the fingerprint sensor element 111 arranged at the first column and the output signal of the fingerprint sensor element 111 neighboring the first column are not simultaneously or consecutively input to the bank 121 of the filter and buffer unit 120. As described above with reference to FIG. 2, the output signal is generated by a flow of an electrical signal at a circuit included inside the fingerprint sensor element 111, and such a flow of the electrical signal serves as an external noise against the neighboring fingerprint sensor element 111. In the present invention, the output signals of the fingerprint sensor elements 111 arranged at the neighboring column are not simultaneously or consecutively acquired, so that an effect due to an operation of the neighboring fingerprint sensor elements 111 may be minimized. That is, in the sensor array 110, a fingerprint detection operation with respect to the fingerprint sensor elements 111 existing at the second column is performed after an fingerprint detection operation with respect to the fingerprint sensor elements 111 existing at the (1+k)-th column, the (1+2k)-th column, . . . , and the (1+(1−1)k-th) column has been completed, instead of consecutively being performed after the fingerprint detection operation with respect to the fingerprint sensor elements 111 existing the first column has been completed, so that an effect due to the fingerprint detection operation of the fingerprint sensor elements 111 arranged at the first column may be prevented. In other words, since each of the k blocks configuring the banks 121 and 122 of the filter and buffer unit 120 receives the output signals of the fingerprint sensor elements 111 arranged at plural columns spaced apart from each other by k columns at regular intervals among the plurality of fingerprint sensor elements 111, the fingerprint sensor elements 111 operating simultaneously or consecutively are spaced apart from each other by the k columns to be immune from a mutual interference.

Also, according to the exemplary embodiment, when the sensor array 110 is configured with fingerprint sensor elements 111 arranged in M columns, instead of operating a column from a first column to an M-th column one by one, fingerprint detection operations with respect to the first column to an M/2th column of the fingerprint sensor elements 111 and with respect to a column next the M/2th column to the M-th column thereof may be performed at the same time. As described above, a data output from the fingerprint sensor element 111 is performed when the third switch S3 (See FIGS. 2 and 3) thereof is maintained in an ON state, and, according to the exemplary embodiment, the third switches S3 in at least two fingerprint sensor elements 111 may be simultaneously maintained in the ON state.

The reason is that the filter and buffer unit 120 is configured with the plurality of banks 121 and 122 so that the fingerprint detection operations with respect to the first column of the fingerprint sensor elements 111 and with respect to an ((M/2)+1)-th column thereof are simultaneously performed. Consequently, a speed of the fingerprint detection operation for the entire sensor array 110 is accelerated.

Heretofore, although an example of the filter and buffer unit 120 configured with the two banks 121 and 122 has been described, the number of banks may be varied, and it may be sufficient that each bank may receive output signals of some of columns different from each other of the sensor array 110 to process them in parallel. For example, the number of banks may be a natural number equal to or greater than 2. Meanwhile, in the sensor array 110, since each bank is preferable to receive data output from the same number of columns, it may be preferable to implement the number of banks as a divisor of the number of columns of the fingerprint sensor elements 111 configuring the sensor array 110.

Also, each of the plurality of blocks 121_B1, 121_B2, 121_Bk, 122_B1, 122_B2, 122_Bk may be configured with the number of pages the same as the number of columns configuring a column group of the sensor array 110 transmitting data to each block.

Meanwhile, the sample and hold unit 130 according to the exemplary embodiment is also configured with the plurality of banks 131 and 132. The number of banks 131 and 132 may be implemented the same as the number of banks 121 and 122 of the filter and buffer unit 120. The banks 131 and 132 configuring the sample and hold unit 130 receive signals from the banks 121 and 122 configuring the filter and buffer unit 120, respectively, to sample, hold, and store values. For this purpose, each of the banks 131 and 132 of the sample and hold unit 130 may also be configured with the same numbers as the numbers of blocks and pages of each of the banks 121 and 122 of the filter and buffer unit 120.

When the sensor array 110 includes the fingerprint sensor elements 111 arranged in M columns, output signals from a first column to an (M/2)-th column of the fingerprint sensor elements 111 are subject to a noise elimination and temporarily stored through the first bank 121 of the filter and buffer unit 120 to be input to the first bank 131 of the sample and hold unit 130. Simultaneously, output signals from an ((M/2)+1)-th column to an M-th column of the fingerprint sensor elements 111 are subject to a noise elimination and temporarily stored through the second bank 122 of the filter and buffer unit 120 to be input to the second bank 132 of the sample and hold unit 130. That is, a noise elimination operation and a sampling operation may be performed with respect to the output signals from the first to (M/2)-th columns of the fingerprint sensor elements 111 and from the ((M/2)+1)-th to M-th columns thereof at the same time. Therefore, a speed of the fingerprint detection operation with respect to the entire sensor array 110 may be increased in proportion to the number of banks 121, 122, 131, and 132 provided in the filter and buffer unit 120 and the sample and hold unit 130.

Output signals from the banks 131 and 132 of the sample and hold unit 130 are input to the signal processor 140. The output signals of the sample and hold unit 130 are subject to an offset adjustment, amplified to have a predetermined gain, and converted into a digital signal through the RDC141, the PGA142, the DSG143, and the ADC144 of the signal processor 140.

The signals converted into the digital signal are input to the input/output unit 150 and then simultaneously output to the memory 170.

In accordance with one exemplary embodiment of the present invention, the memory 170 may also be implemented to be divided into a plurality of banks (not shown) to process an input and output of data by plural numbers at the same time, but it is not limited thereto.

Description of the present invention has been illustratively provided, and it should be understood that numerous other modifications and embodiments can be easily devised by those skilled in the art without changing the technical spirit or essential features of the present invention. Therefore, the embodiments disclosed herein should be construed as a number of illustrative embodiments of the present invention and not to be limited thereto. For example, each component described as a single form may be performed in a distributed manner, and similarly, components described to be distributed may be performed as a combined form.

The scope of the present invention will be represented by the appended claims, and it should be construed that modifications or other embodiments derived from the meaning, range, and equivalents of the appended claims are included in the scope of the present invention.

The invention claimed is:

1. A fingerprint detection device comprising:
a sensor array comprising a plurality of fingerprint sensor elements arranged in a matrix having a plurality of rows and columns;
a filter and buffer unit comprising a plurality of first banks, each of which is configured to perform a noise elimination operation and a temporal storage operation in parallel with respect to output signals of different columns of the sensor array, wherein each of the plurality of first banks simultaneously or consecutively acquires output signals from the fingerprint sensor elements belonging to columns spaced apart from each other by a predetermined distance;
a sample and hold unit comprising a plurality of second banks, the number of second banks being equal to the number of first banks so as to perform a sampling and hold function in parallel in response to output signals from the plurality of first banks; and
an input/output unit configured to receive an output signal from the sample and hold unit to output data of the sensor array.

2. The fingerprint detection device of claim 1, wherein:
each of the first and second banks comprises n blocks;
the n blocks receive in parallel the output signals of the fingerprint sensor elements from a group of columns of the sensor array corresponding to the first and second banks; and
the columns in the group are spaced apart from each other.

3. The fingerprint detection device of claim 2, wherein:
each of the blocks of the first and second banks comprises pages, the number of pages being equal to the number of columns belonging to the group of the sensor array; and
each of the pages receives the output signals of the columns arranged to be spaced apart from each other and belonging to the group of the sensor array.

4. A driving method for a fingerprint detection device comprising a plurality of fingerprint sensor elements arranged in a matrix, comprising:
inputting output signals with respect to different columns of a sensor array in parallel to assigned banks among a plurality of first banks of a filter and buffer unit, wherein output signals from the fingerprint sensor elements belonging to columns spaced apart from each other by a predetermined distance are simultaneously or sequentially input;
inputting output signals from the first banks in parallel to second banks of a sample and hold unit corresponding to the first banks; and
inputting output signals from the sample and hold unit to an input/output unit via a signal processor.

5. The driving method for a fingerprint detection device of claim 4, wherein:
each of the first and second banks comprise n blocks, and
the inputting output signals with respect to different columns of a sensor array in parallel to assigned banks among a plurality of first banks of a filter and buffer unit comprises inputting the output signals of the fingerprint sensor elements from a group of columns of the sensor array configured with the columns spaced apart from each other, to each of the blocks.

6. The driving method for a fingerprint detection device of claim 5, wherein:
each of the blocks comprises pages, the number of pages being equal to the number of columns belonging to the group of the columns of the sensor array; and
the inputting output signals with respect to different columns of a sensor array in parallel to assigned banks among a plurality of first banks of a filter and buffer unit comprises each of the pages receiving the output signals of the columns spaced apart from each other and belonging to the group of the columns of the sensor array.

* * * * *